(12) United States Patent
Akiyama et al.

(10) Patent No.: US 10,192,797 B2
(45) Date of Patent: Jan. 29, 2019

(54) SEMICONDUCTOR DEVICE AND ELECTRICAL CONTACT STRUCTURE THEREOF

(71) Applicant: Mitsubishi Electric Corporation, Tokyo (JP)

(72) Inventors: Hajime Akiyama, Tokyo (JP); Akira Okada, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/113,818

(22) PCT Filed: Mar. 6, 2014

(86) PCT No.: PCT/JP2014/055714
§ 371 (c)(1),
(2) Date: Jul. 23, 2016

(87) PCT Pub. No.: WO2015/132924
PCT Pub. Date: Sep. 11, 2015

(65) Prior Publication Data
US 2016/0343627 A1    Nov. 24, 2016

(51) Int. Cl.
*H01L 23/58* (2006.01)
*H01L 29/10* (2006.01)
(Continued)

(52) U.S. Cl.
CPC .............. *H01L 22/32* (2013.01); *G01R 31/26* (2013.01); *H01L 22/14* (2013.01);
(Continued)

(58) Field of Classification Search
CPC ... H01L 22/32; H01L 22/34; H01L 23/53214; H01L 23/53242; H01L 21/768; H01L 22/14; H01L 22/30
See application file for complete search history.

(56) References Cited

U.S. PATENT DOCUMENTS 5,353,498 A * 10/1994 Fillion ................. H01L 21/568
257/E21.505
7,944,059 B2   5/2011 Nagai et al.
(Continued)

FOREIGN PATENT DOCUMENTS

CN    1913140 A    2/2007
JP    08-162429 A    6/1996
(Continued)

OTHER PUBLICATIONS

Notification of Transmittal of Translation of the International Preliminary Report on Patentability and Translation of Written Opinion of the International Searching Authority; PCT/JP2014/055714 dated Sep. 15, 2016.
(Continued)

*Primary Examiner* — Ismail Muse
(74) *Attorney, Agent, or Firm* — Studebaker & Brackett PC

(57) ABSTRACT

A purpose of the present invention is to provide a semiconductor device that can restrain occurrence of partial discharge in evaluation of electric characteristics and can carry out failure analysis from the upper side of a measurement object. A semiconductor device according to the present invention includes: at least one electrode; a protective layer having at least one opening part provided such that a portion of the electrode is exposed at the opening part, and being formed to cover the other portion of the electrode excluding the portion of the electrode exposed at the opening part, the protective layer being insulative; and a conductive layer
(Continued)

formed so as to cover the protective layer and the opening part and be directly connected to the electrode at the opening part.

19 Claims, 4 Drawing Sheets

(51) Int. Cl.
*H01L 21/66* (2006.01)
*H01L 23/532* (2006.01)
*G01R 31/26* (2014.01)

(52) U.S. Cl.
CPC .. *H01L 23/53214* (2013.01); *H01L 23/53242* (2013.01); *H01L 2224/0603* (2013.01)

(56) References Cited

U.S. PATENT DOCUMENTS

| | | | | |
|---|---|---|---|---|
| 8,193,608 | B2* | 6/2012 | Yabu | H01L 27/0207 257/565 |
| 8,445,295 | B2 | 5/2013 | Shibuya et al. | |
| 2001/0015439 | A1* | 8/2001 | Hembree | H01L 22/32 257/48 |
| 2001/0040297 | A1* | 11/2001 | Yoon | H01L 23/49816 257/774 |
| 2003/0227079 | A1* | 12/2003 | Chia | H01L 23/3114 257/723 |
| 2004/0063039 | A1* | 4/2004 | Liang | H01F 17/0013 430/312 |
| 2004/0070042 | A1* | 4/2004 | Lee | H01L 24/03 257/459 |
| 2005/0051831 | A1* | 3/2005 | Kajimoto | H01L 21/76838 257/314 |
| 2005/0146013 | A1* | 7/2005 | Farnworth | H01L 22/32 257/691 |
| 2005/0250315 | A1* | 11/2005 | Tran | H01L 21/7681 438/637 |
| 2007/0052085 | A1 | 3/2007 | Nagai et al. | |
| 2007/0257323 | A1* | 11/2007 | Tsui | H01L 23/485 257/382 |
| 2008/0042275 | A1* | 2/2008 | Kuan | H01L 22/34 257/738 |
| 2009/0014869 | A1* | 1/2009 | Vrtis | H01L 24/05 257/737 |
| 2009/0166843 | A1 | 7/2009 | Kutter et al. | |
| 2010/0044770 | A1 | 2/2010 | Lee | |
| 2010/0237506 | A1* | 9/2010 | Brunnbauer | H01L 24/11 257/773 |
| 2011/0024911 | A1 | 2/2011 | Shibuya et al. | |
| 2011/0049728 | A1 | 3/2011 | Pagani | |
| 2011/0215481 | A1 | 9/2011 | Nagai et al. | |
| 2011/0227204 | A1* | 9/2011 | Kutter | H01L 21/6835 257/666 |
| 2012/0037221 | A1* | 2/2012 | Kim | H01B 1/22 136/256 |
| 2012/0056278 | A1* | 3/2012 | Zhong | H01L 21/28518 257/412 |
| 2012/0228704 | A1* | 9/2012 | Ju | H01L 29/402 257/339 |
| 2013/0093079 | A1* | 4/2013 | Tu | H01L 23/3192 257/737 |
| 2013/0328096 | A1* | 12/2013 | Donofrio | H01L 33/12 257/99 |
| 2014/0016408 | A1* | 1/2014 | Lee | H01L 27/11551 365/185.2 |
| 2015/0060891 | A1* | 3/2015 | Jin | H01L 31/173 257/82 |
| 2015/0137381 | A1* | 5/2015 | Yap | H01L 24/94 257/773 |
| 2015/0371947 | A1* | 12/2015 | Chen | H01L 23/3128 257/774 |

FOREIGN PATENT DOCUMENTS

| | | |
|---|---|---|
| JP | 10-096746 A | 4/1998 |
| JP | 2002-368219 A | 12/2002 |
| JP | 2003-130889 A | 5/2003 |
| JP | 2007-048853 A | 2/2007 |
| JP | 2010-050450 A | 3/2010 |
| JP | 2011-003911 A | 1/2011 |
| JP | 2011-034999 A | 2/2011 |

OTHER PUBLICATIONS

International Search Report, PCT/JP2014/055714 dated Apr. 28, 2014.
An Office Action; "Notification of Reason for Refusal" issued by the Korean Patent Office dated Sep. 19, 2017, which corresponds to Korean Patent Application No. 10-2016-7024445 and is related to U.S. Appl. No. 15/113,818; with English language translation.
An Office Action issued by the Korean Patent Office dated Mar. 30, 2018, which corresponds to Korean Patent Application 10-2016-7024445 and is related to U.S. Appl. No. 15/113,818.
An Office Action issued by the Korean Patent Office (KIPO) dated May 21, 2018, which corresponds to Korean Patent Application No. 10-2016-7024445 and is related to U.S. Appl. No. 15/113,818; with English language translation.
An Office Action issued by the Chinese Patent Office (SIPO) dated Apr. 4, 2018, which corresponds to Chinese Patent Application No. 201480076887.0 and is related to U.S. Appl. No. 15/113,818.
An Office Action; "Notification of Reason(s) for Refusal" issued by the Japanese Patent Office dated Jan. 17, 2017, which corresponds to Japanese Patent Application No. 2016-506030 and is related to U.S. Appl. No. 15/113,818; with English language partial translation.
An Office Action issued by the Chinese Patent Office (SIPO) dated Oct. 24, 2018, which corresponds to Chinese Patent Application No. 201480076887.0 and is related to U.S. Appl. No. 15/113,818; with English language translation.

* cited by examiner

SEMICONDUCTOR DEVICE AND ELECTRICAL CONTACT STRUCTURE THEREOF

TECHNICAL FIELD

The present invention relates to a semiconductor device and particularly relates to a semiconductor device improved in evaluation of electric characteristics.

BACKGROUND ART

When, by using, as a measurement object, a semiconductor device such as a semiconductor chip or a semiconductor wafer integrating the semiconductor chip, and the electric characteristics thereof are to be evaluated, an installation surface of the measurement object is brought into contact with and fixed to a surface of a chuck stage by vacuum suction or the like, and then, contact probes are brought into contact with a surface, which is different from the installation surface of the measurement object, in order to carry out electrical input/output. In this process, in response to conventional demands, etc. for application of large currents or high voltages, pins of the contact probes have been multiplied.

It is known that, if the electric characteristics of the measurement objects are evaluated under such circumstances, a partial discharge phenomenon occurs during the evaluation, which leads to a partial problem of the measurement object. Herein, the partial discharge phenomenon refers to a phenomenon in which partial discharge occurs, for example, between the contact probe and the measurement object or between the contact probes.

If the partial discharge occurred in the evaluation is overlooked and the measurement object (defective product) in which the partial discharge has originally occurred is sent to a post-process in a state where the measurement object (defective product) is determined as a non-defective product in the evaluation, it is extremely difficult to extract the measurement object, in which the partial discharge has originally occurred, as a defective product in the post-process. Therefore, in order to prevent the measurement object, in which the partial discharge has occurred, from being sent to the post-process, it is important to restrain the partial discharge when the electric characteristics of the measurement object are evaluated.

Conventionally, techniques of preventing occurrence of discharge in a characteristic inspection of an electronic component by carrying out the characteristic inspection (characteristic evaluation) in insulating liquid have been disclosed (for example, see Patent Document 1).

Moreover, techniques of preventing occurrence of discharge in a characteristic inspection by carrying out the characteristic inspection in a closed space filled with an inert gas have been disclosed (for example, see Patent Document 2).

Moreover, recently, techniques of carrying out failure analysis by infrared spectroscopy or the like from the upper side of a measurement object in electrical evaluation have been disclosed.

PRIOR ART DOCUMENTS

Patent Documents

Patent Document 1: Japanese Patent Application Laid-Open No. 2003-130889

Patent Document 2: Japanese Patent Application Laid-Open No. 1110-96746 (1998)

SUMMARY OF INVENTION

Problems to be Solved by the Invention

In Patent Document 1, there have been problems that expensive probers are required and that the time required for an evaluation step for carrying out the evaluation in the liquid is increased, thereby not contributing to cost reduction. Moreover, in a case where the measurement object is a semiconductor element in a chip test or a wafer test, the insulating liquid has to be completely removed from the semiconductor element after the evaluation, and complete removal thereof has been difficult.

In Patent Document 2, there has been a problem that the configuration of an evaluation apparatus is complicated and does not enable cost reduction. Moreover, there has been a problem that the time required for an evaluation step is increased.

In the case where failure analysis is carried out by infrared spectroscopy or the like from the upper side of a measurement object in electric evaluation, since a plurality of contact probes for establishing electric connections are disposed on the measurement object, there has been a problem that the parts of the measurement object blocked by the contact probes become undetectable regions in the failure analysis. Moreover, if the contact positions of the contact probes are positioned at an end of the measurement object in order to restrain the partial discharge between the contact probes, there has been a problem that the end of the measurement object and the contact probes become close to each other and facilitate occurrence of the partial discharge.

The present invention has been accomplished to solve such problems and it is an object to provide a semiconductor device capable of restraining occurrence of the partial discharge in the evaluation of electric characteristics and capable of carrying out failure analysis from the upper side of a measurement object.

Means for Solving the Problems

In order to solve above described problems, a semiconductor device according to the present invention includes: at least one electrode; a protective layer having at least one opening part provided such that a portion of the electrode is exposed at the opening part, and being formed to cover the other portion of the electrode excluding the portion of the electrode exposed at the opening part, the protective layer being insulative; and a conductive layer formed so as to cover the protective layer and the opening part and be directly connected to the electrode at the opening part.

Effects of the Invention

According to the present invention, a semiconductor device includes: at least one electrode; a protective layer having at least one opening part provided such that a portion of the electrode is exposed at the opening part, and being formed to cover the other portion of the electrode excluding the portion of the electrode exposed at the opening part, the protective layer being insulative; and a conductive layer formed so as to cover the protective layer and the opening part and be directly connected to the electrode at the opening part. Therefore, occurrence of partial discharge in evaluation of electric characteristics can be restrained, and failure analysis can be carried out from the upper side of a measurement object.

The objects, features, aspects, and advantages of the present invention will become more apparent from the following detailed descriptions and the accompanying drawings.

DESCRIPTION OF EMBODIMENTS

Embodiments of the present invention will be described below with reference to the drawings.

<First Embodiment>

First, a configuration of a semiconductor evaluation apparatus which evaluates electric characteristics of a semiconductor device will be described.

Figure 1:
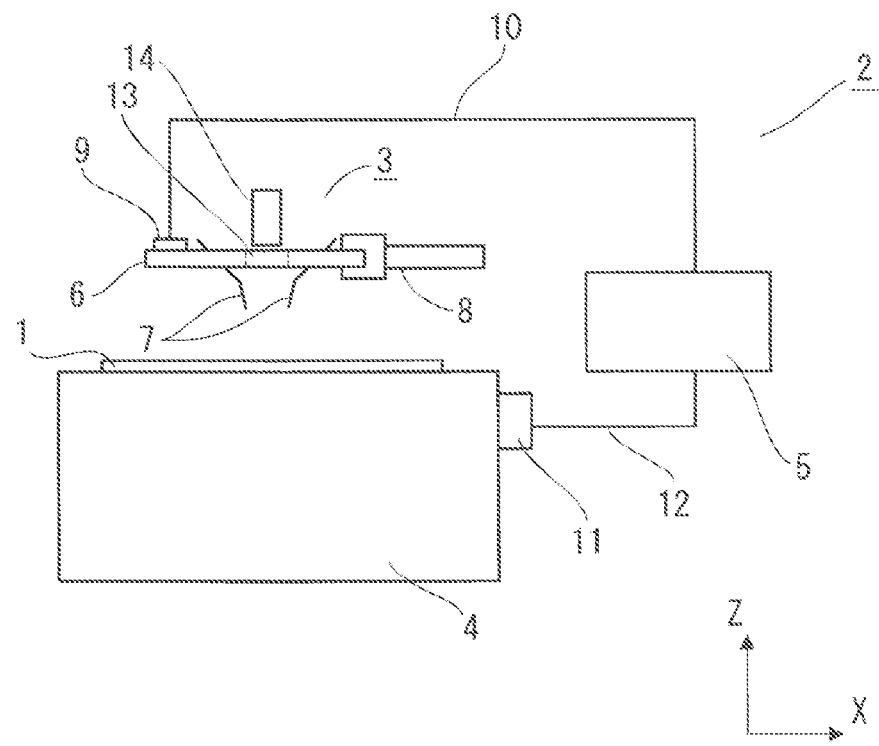
FIG. 1 is a view showing an example of a configuration of a semiconductor evaluation apparatus according to a first embodiment of the present invention.

FIG. 1 is a view showing an example of a configuration of a semiconductor evaluation apparatus 2 according to the first embodiment of the present invention.

Note that, in the first embodiment, a semiconductor device 1 is described on the assumption that it has a vertical structure in which a large current flows in a Z direction, in other words, out-of-plane direction of the drawing. Note that the semiconductor device 1 is not limited to have the vertical structure, but may have a horizontal structure in which input/output is carried out in one plane.

As shown in FIG. 1, the semiconductor evaluation apparatus 2 is provided with a probe base 3, a chuck stage 4, and an evaluation/control unit 5.

The probe base 3 and the evaluation/control unit 5 are electrically connected to each other via a connection part 9 and a signal line 10.

The chuck stage 4 and the evaluation/control unit 5 are electrically connected to each other via a connection part 11 and a signal line 12.

The probe base 3 is provided with an insulating base 6, contact probes 7, and the connection part 9.

The contact probes 7 are fixed to the insulating base 6, and the number thereof is plural on the assumption of application of large currents.

The connection part 9 is provided for connecting the insulating base 6 and the signal line 10 to each other.

The contact probes 7 and the connection part 9 are connected, for example, by a metal plate (not shown) provided on the insulating base 6.

In order to carry out failure analysis by infrared spectroscopy or the like from the upper side of a measurement object in electrical evaluation, a through hole 13 is provided in the insulating base 6, and a camera 14, which is used in the failure analysis, is installed above the through hole 13. Note that it is not limited to the camera 14, but may be anything as long as failure analysis can be carried out.

The probe base 3 can be moved in an arbitrary direction by a moving arm 8.

The chuck stage 4 is a mount for contacting and fixing the semiconductor device 1 on the surface thereof. Herein, as a method of fixing the semiconductor device 1, for example, the semiconductor device 1 may be fixed by vacuum suction or may be fixed by electrostatic suction or the like.

The evaluation/control unit 5 evaluates the electric characteristics of the semiconductor device 1. Moreover, in evaluation, the evaluation/control unit 5 controls the current and voltage applied to the semiconductor device 1.

Note that, the connection part 9 provided on the insulating base 6 and the connection part 11 provided on a lateral surface of the chuck stage 4 are provided at the positions such that the mutual distances thereof are approximately the same distances via any of the contact probes 7.

Moreover, instead of moving the probe base 3 by the moving arm 8, the chuck stage 4 may be configured to be moved.

When the electric characteristics of the semiconductor device 1 are evaluated by the semiconductor evaluation apparatus 2, electrodes (electrode pads) formed on a surface of the semiconductor device 1 and the plurality of contact probes 7 contact each other. Moreover, electrodes formed on a back surface of the semiconductor device 1 and the surface of the chuck stage 4 contact each other. When currents or voltages are applied to the semiconductor device 1 via the contact probes 7 and the chuck stage 4 in such a state, the electric characteristics of the semiconductor device 1 are evaluated.

Next, a configuration of the semiconductor device 1 will be described in the order of manufacturing steps with reference to FIGS. 2 to 4.

Figure 2:
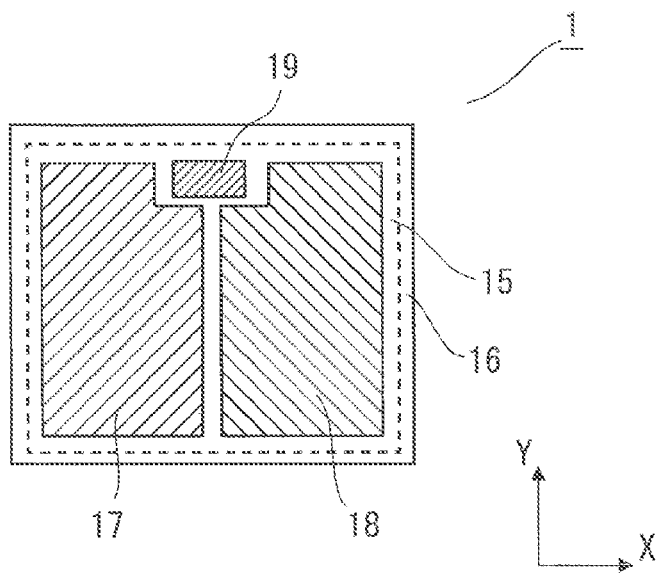
FIG. 2 is a plan view showing an example of a configuration of a semiconductor device according to the first embodiment of the present invention.

FIG. 2 is a plan view showing an example of the configuration of the semiconductor device 1.

Note that, the first embodiment will be described on the assumption that the semiconductor device 1 is a single vertical Insulated Gate Bipolar Transistor (IGBT), but may be a different semiconductor element such as a Metal Oxide Semiconductor Field Effect Transistor (MOSFET).

As shown in FIG. 2, the semiconductor device 1 has an element region 15 (region inside a broken line of the drawing) and a terminal region 16 (region outside the broken line of the drawing).

In the element region 15, a desired semiconductor element, in this case, an IGBT is formed.

On a surface of the element region 15, emitter electrodes 17 and 18 and a gate electrode 19 are formed as electrode pads. Note that the positions and numbers of the electrodes are not limited to those of FIG. 2, but are arbitrary.

Moreover, on a back surface of the element region 15, a collector electrode (corresponding to a collector electrode 29 shown in later-described FIG. 5) is formed.

The terminal region 16 is provided in an outer peripheral part of the element region 15 in order to maintain a breakdown voltage.

Figure 3:
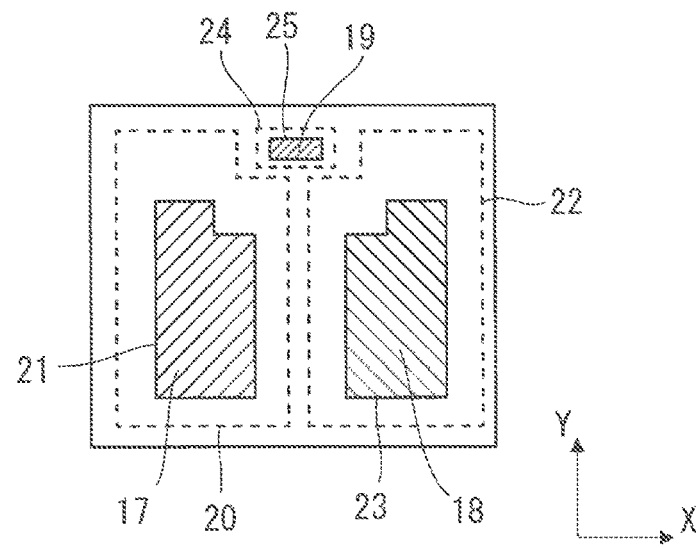
FIG. 3 is a plan view showing an example of the configuration of the semiconductor device according to the first embodiment of the present invention.

FIG. 3 is a plan view showing an example of the configuration of the semiconductor device 1 after protective layers 20, 22, and 24 are formed with respect to the semiconductor device 1 of FIG. 2.

As shown in FIG. 3, on the emitter electrode 17, the protective layer 20 is formed so as to have an opening part 21 provided such that a portion of the emitter electrode 17 is exposed at the opening part 21, and to cover the other portion of the emitter electrode 17 excluding the portion of the emitter electrode 17 exposed at the opening part 21, the protective layer 20 being insulative.

On the emitter electrode 18, the protective layer 22 is formed so as to have an opening part 23 provided such that a portion of the emitter electrode 18 is exposed at the opening part 23, and to cover the other portion of the emitter electrode 18 excluding the portion of the emitter electrode 18 exposed at the opening part 23, the protective layer 22 being insulative.

On the gate electrode 19, the protective layer 24 is formed so as to have an opening part 25 provided such that a portion of the gate electrode 19 is exposed at the opening part 25, and to cover the other portion of the gate electrode 19 excluding the portion of the gate electrode 19 exposed at the opening part 25, the protective layer 24 being insulative.

Note that the protective layers 20, 22, and 24 are formed so as to cover the emitter electrodes 17 and 18 and the gate electrode 19, respectively, but may be formed so as to cover the entire surface of the semiconductor device 1. In this case, the protective layers 20, 22, and 24 are integrally formed.

The protective layers 20, 22, and 24 are formed of a material which is thermally and chemically stable in evaluation of electric characteristics and is excellent in insulation performance. Specifically, examples of the material include a photoresist and sheet materials having insulation properties (for example, polyimide, Kapton (registered trademark), polyphenyl silsesquioxane, and polyvinyl silsesquioxane, but are not limited thereto.

Figure 4:
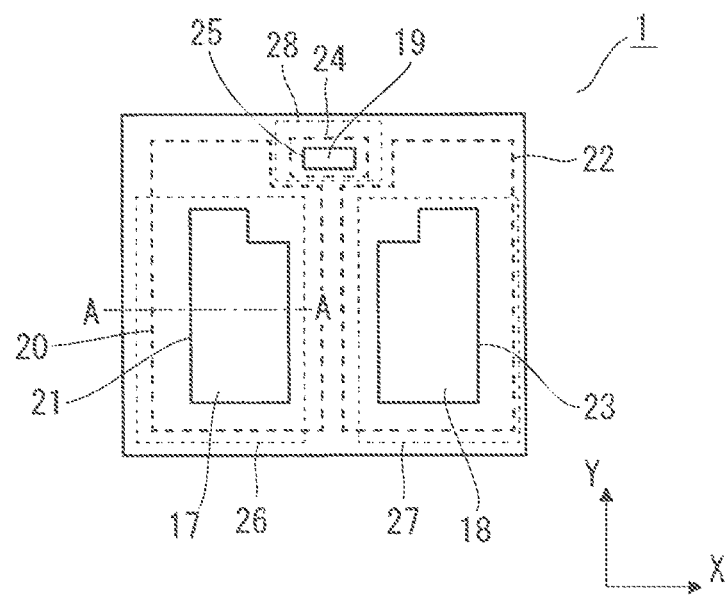
FIG. 4 is a plan view showing an example of the configuration of the semiconductor device according to the first embodiment of the present invention.

FIG. 4 is a plan view showing an example of the configuration of the semiconductor device 1 after conductive layers 26 to 28 are formed with respect to the semiconductor device 1 of FIG. 3. Moreover, FIG. 5 is a cross-sectional view showing an A-A cross section of FIG. 4. Note that, in FIG. 4, illustration of the terminal region is omitted.

As shown in FIG. 4, on the protective layer 20 and the opening part 21, the conductive layer 26 is formed so as to cover the protective layer 20 and the opening part 21 and be directly connected to the emitter electrode 17 at the opening part 21.

On the protective layer 22 and the opening part 23, the conductive layer 27 is formed so as to cover the protective layer 22 and the opening part 23 and be directly connected to the emitter electrode 18 at the opening part 23.

On the protective layer 24 and the opening part 25, the conductive layer 28 is formed so as to cover the protective layer 24 and the opening part 25 and be directly connected to the gate electrode 19 at the opening part 25.

According to the above description, the protective layers 20, 22, and 24 are separately formed on the emitter electrodes 17 and 18 and the gate electrode 19, respectively.

Figure 5:
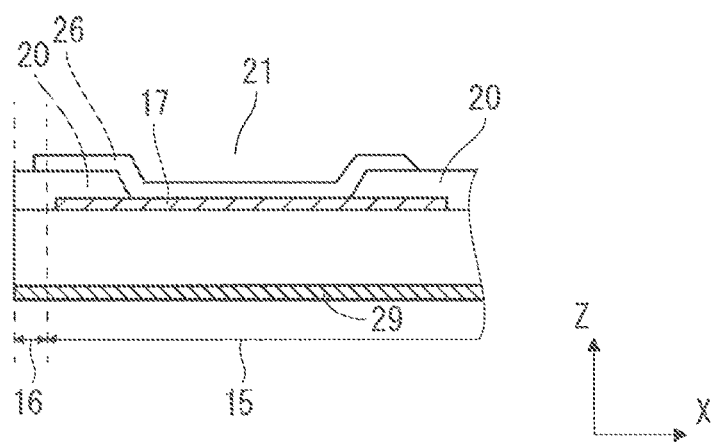
FIG. 5 is a cross-sectional view showing an A-A cross section of FIG. 4.

As shown in FIG. 5, the protective layer 20 is formed to an end of the semiconductor device 1, and the conductive layer 26 is formed in a portion of the terminal region 16. In other words, the conductive layer 26 is not formed at the end of the semiconductor device 1. This is for restraining occurrence of discharges or short-circuits between an exposed end surface (lateral surface) of the semiconductor device 1 and the conductive layer 26. Note that the conductive layer 26 may be formed only in the element region 15 without forming the conductive layer 26 in the terminal region 16. Also, similar things also apply to the other conductive layers 27 and 28.

The conductive layers 26 to 28 are formed of materials which are thermally and chemically stable in evaluation of electric characteristics and are excellent in electric conductivity. Specific examples of the materials include metal films of, for example, aluminum, gold, or a compound, but are not limited thereto. For example, in a case where the conductive layers 26 to 28 are metal films, the metal films may have aluminum as a main component or may have gold as a main component. Herein, the main component refers to a component having a prominent existing rate with respect to the entirety compared with a non-main component(s) and, for example, refers to a component which exists by a rate not less than several tens of times the non-main component(s).

Meanwhile, the conductive layers 26 to 28 may be formed by stacking a plurality of layers. In that case, the stacked layers may be formed of the same materials or may be formed of mutually different materials. By virtue of employing such a configuration, effects such as ensuring of electric conductivity or restraining of heat generation of the semiconductor device 1 because of reduction in current density are obtained.

Formation of the conductive layers 26 to 28 is carried out by sputtering or the like. For example, in a case where the protective layers 20, 22, and 24 are photoresists, sputtering using the photoresists as masks is difficult; however, since the formation regions of the conductive layers 26 to 28 are comparatively large, the formation regions of the conductive layers 26 to 28 can be selected (specified) by sputtering using metal masks.

Note that, in a case where fine formation regions of the conductive layers 26 to 28 are selected, sheet materials may be used as the protective layers 20, 22, and 24, and sputtering using photoresists as masks may be carried out.

Meanwhile, in order to ensure the adhesiveness and contact property between the emitter electrodes 17 and 18 and the gate electrode 19 and the conductive layers 26 to 28, the surfaces of the emitter electrodes 17 and 18 and the gate electrode 19 may be roughened. Examples of the method of roughening the surfaces include a method of carrying out slight etching with respect to the surfaces and a method of carrying out sandblast processing for a short period of time with respect to the surfaces.

In the configuration, when the electric characteristics of the semiconductor device 1 are to be actually evaluated, the semiconductor device 1 of FIG. 4 is placed on the chuck stage 4 of FIG. 1 to carry out the evaluation. Specifically, the contact probes 7 are brought into contact with part of the conductive layers 26 to 28. In this process, the plurality of contact probes 7 contact the conductive layers 26 to 28. Then, by applying currents or voltages to the semiconductor device 1, the electric characteristics of the semiconductor device 1 are evaluated.

After the evaluation, decomposition removal, peel-off removal, or the like of the protective layers 20, 22, and 24 is carried out, followed by a post-step. In this process, the conductive layers 26 to 28 are also removed at the same time. For example, in a case where the protective layers 20, 22, and 24 are photoresists, after the photoresists are subjected to decomposition removal in an ashing step, cleaning is carried out in accordance with needs. Meanwhile, in a case where the protective layers 20, 22, and 24 are sheet materials, peel-off removal is basically carried out; however, the process proceeds to a packaging step, which is a post-process, without carrying out peel-off removal to maintain a discharge preventing effect. Meanwhile, in a case where the protective layers 20, 22, and 24 are sheet materials (for example, sheet materials formed of Kapton) having adhesive layers, attachment/detachment is easy.

As described above, according to the first embodiment, occurrence of partial discharge in evaluation of the electric characteristics of the semiconductor device 1 can be restrained. Moreover, since usage of photoresists as the protective films enables processing in a normal step, cost can be reduced. Moreover, since the positions of the contact probes 7 can be moved to the end of the semiconductor device 1 while restraining partial discharge, failure analysis from the upper side of the semiconductor device 1 becomes easy.

Note that, in the above description, the semiconductor device 1 has been described as a single vertical IGBT, but may be a wafer. More specifically, the semiconductor device 1 may be a wafer having a plurality of sets of the emitter electrodes 17 and 18, the gate electrode 19, the protective layers 20, 22, and 24, and the conductive layers 26 to 28. In that case, effects such as reduction of evaluation time, improvement of throughput, or reduction of test cost are obtained.

The above description provides the case where the separate conductive layers 26 and 27 are formed with respect to the emitter electrodes 17 and 18, but they are not limited by this. Since the emitter electrodes 17 and 18 are basically at the same electric potentials, the conductive layers 26 and 27 may be integrally formed across the emitter electrodes 17 and 18. In that case, effects that selection of the formation regions of the conductive layers becomes easy and that processing in the step of forming the conductive layers becomes easy are obtained.

<Second Embodiment>

The second embodiment of the present invention is characterized by forming a plurality of opening parts and conductive layers corresponding to the contact probes 7 of FIG. 1. Since other configurations are similar to those of the first embodiment (see FIG. 4), the description thereof is omitted herein.

Figure 6:
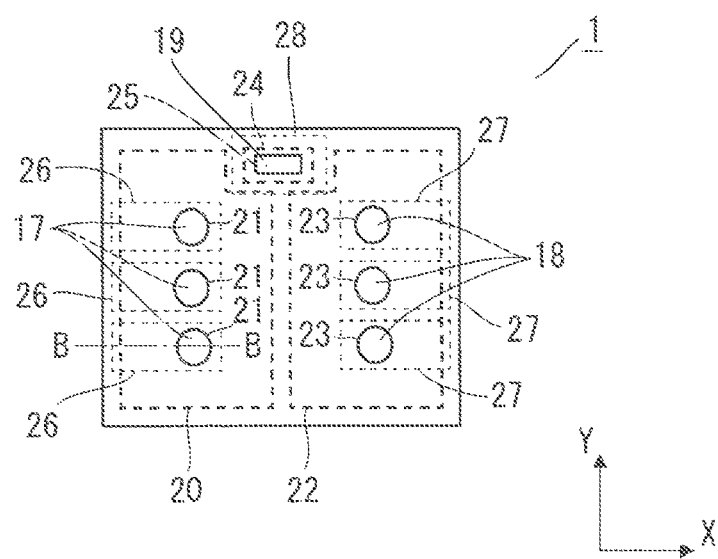
FIG. 6 is a plan view showing an example of the configuration of a semiconductor device according to a second embodiment of the present invention.
Figure 7:
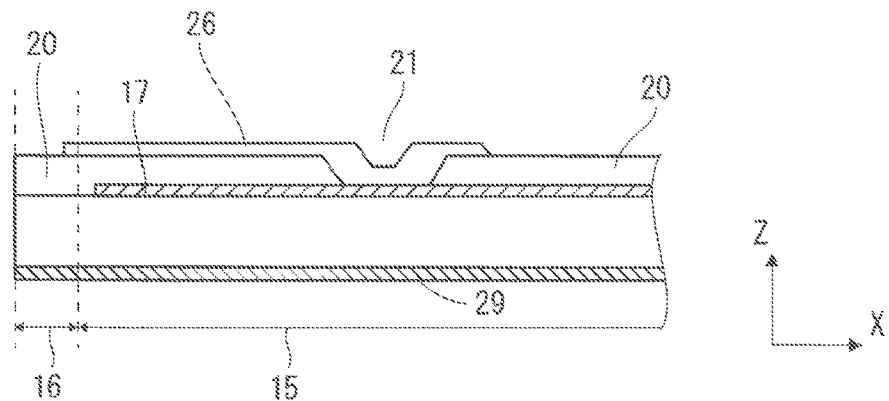
FIG. 7 is a cross-sectional view showing a B-B cross section of FIG. 6.

FIG. 6 is a plan view showing an example of the configuration of a semiconductor device 1 according to the second embodiment. Also, FIG. 7 is a cross-sectional view showing a B-B cross section of FIG. 6.

As shown in FIG. 6, on emitter electrodes 17, a protective layer 20 is formed so as to have three opening parts 21 provided such that portions (three locations) of the emitter electrodes 17 are exposed at the opening parts 21, and to cover the other portions of the emitter electrodes 17 excluding the portions of the emitter electrodes 17 exposed at the opening parts 21. Moreover, on the protective layer 20 and the opening parts 21, three conductive layers 26 are formed so as to cover the protective layer 20 and the opening parts 21 and be directly connected to the emitter electrodes 17 at the opening parts 21, In other words, the conductive layers 26 are separately formed for the opening parts 21, respectively.

On emitter electrodes 18, a protective layer 22 is formed so as to have three opening parts 23 provided such that portions (three locations) of the emitter electrodes 18 are exposed at the opening parts 23, and to cover the other portions of the emitter electrodes 18 excluding the portions of the emitter electrodes 18 exposed at the opening parts 23. Moreover, on the protective layer 22 and the opening parts 23, conductive layers 27 are formed so as to cover the protective layer 22 and the opening parts 23 and be directly connected to the emitter electrodes 18 at the opening parts 23. More specifically, the conductive layers 27 are separately formed for the opening parts 23, respectively.

The configuration at a gate electrode 19 is similar to that of the first embodiment.

In the above described configuration, when the electric characteristics of the semiconductor device 1 are to be actually evaluated, the semiconductor device 1 of FIG. 6 is placed on the chuck stage 4 of FIG. 1 to carry out the evaluation. Specifically, the contact probes 7 are brought into contact with a portion of the conductive layers 26 to 28. In this process, the contact probes 7 individually contact the conductive layers 26 to 28. Then, by applying currents or voltages to the semiconductor device 1, the electric characteristics of the semiconductor device 1 are evaluated.

Note that, in the above description, the case where the three contact probes 7 contact the emitter electrodes 17 and 18, respectively, has been described, but the present invention is not limited thereto. For example, the number of the opening parts may be changed so as to correspond to the number of the contact probes, which is changed depending on the sizes of the electrodes, the magnitude of current, etc. in the semiconductor device.

As described above, according to the second embodiment, partial discharge that occurs in the vicinities of the contact probes 7 or between the contact probes 7 can be more effectively restrained. Moreover, since the current distribution of the semiconductor device 1 to which current has been applied can be equalized in the evaluation of the electric characteristics, heat generation of the semiconductor device 1 can be restrained.

<Third Embodiment>

The third embodiment of the present invention is characterized by forming protective films by stacking a plurality of layers. Since other configurations are similar to those of the first embodiment (see FIG. 4) or the second embodiment (see FIG. 6), the description thereof is omitted herein.

Figure 8:
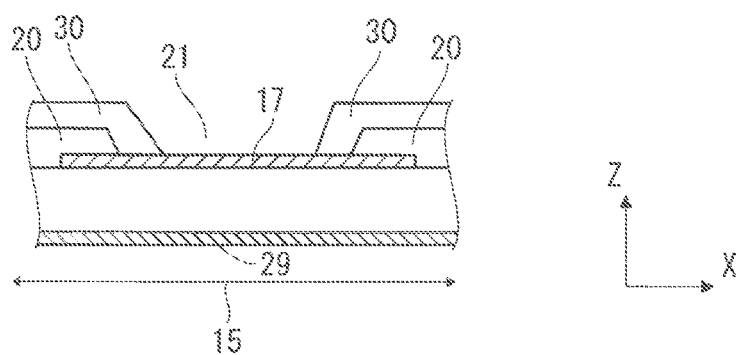
FIG. 8 is a cross-sectional view showing an example of the configuration of a semiconductor device according to a third embodiment of the present invention.

FIG. 8 is a cross-sectional view showing an example of the configuration of a semiconductor device 1 according to the third embodiment. Note that FIG. 8 shows a cross section (A-A cross section of FIG. 4, B-B cross section of FIG. 6) of the region in which the emitter electrode 17 is formed, but does not show the conductive layer 26 and the terminal region 16.

As shown in FIG. 8, on the emitter electrode 17, a protective layer 20 and a protective layer 30 are stacked and formed so as to have an opening part 21 provided such that a portion of the emitter electrode 17 is exposed at the opening part 21, and to cover the other portion of the emitter electrode 17 excluding the portion of the emitter electrode 17 exposed at the opening part 21.

The protective layer 20 and the protective layer 30 are formed such that the protective layer 30 (upper-side layer) covers the protective layer 20 (lower-side layer) on an inner surface of the opening part 21.

Meanwhile, the protective layer 20 and the protective layer 30 may be formed of the same material or may be formed of mutually different materials. For example, the protective layer 20 may be a sheet material, the protective layer 30 may be a photoresist, only the protective layer 30 may be removed after evaluation of the electric characteristics, and a post-process may be carried out with the protective layer 20 remaining. This is effective when wire bonding is carried out in the post-process in which a larger opening is required.

Note that, in the above description, the case where the protective layer is formed of two layers has been described, but the present invention is not limited thereto. Particularly in order to restrain excessive unevenness at the opening part, the configuration is only required such that a protective layer formed later covers a protective layer formed first. When such a configuration is employed, a conductive layer formed thereafter can be easily formed such that it is not interrupted.

In the above description, the region in which the emitter electrode 17 is formed has been described as an example; however, other electrodes also have similar configurations.

As described above, according to the third embodiment, by forming the protective layer by stacking the plurality of layers, partial discharge which occurs in the vicinities of the contact probes 7 or between the contact probes 7 can be more effectively restrained.

<Fourth Embodiment>

It is known that, in a semiconductor device, partial discharge frequently occurs not only in an element region at a center part, which contacts contact probes, but also in vicinities of a terminal region serving as an outer peripheral part (for example, between a lateral surface and a conductive layer of the semiconductor device). Therefore, it is desired to restrain occurrence of partial discharge in the vicinities of the terminal region.

The fourth embodiment of the present invention is characterized by forming a protective layer, which is formed in the vicinity of the terminal region, with a plurality of layers. Since other configurations are similar to the first embodiment (see FIG. 4) or the second embodiment (see FIG. 6), the description thereof is omitted herein.

Figure 9:
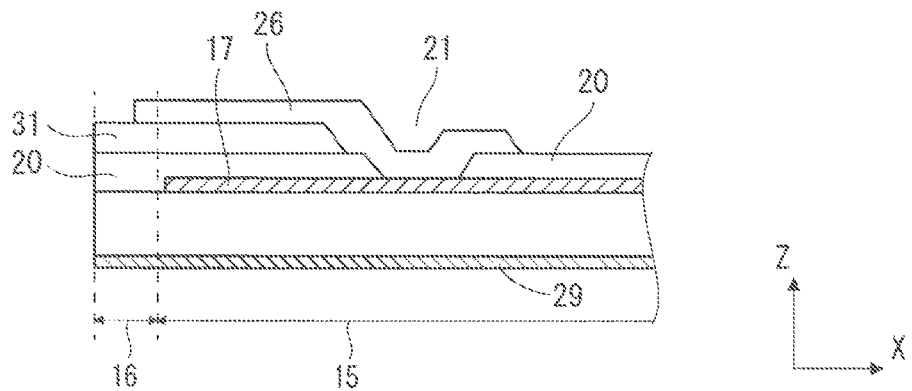
FIG. 9 is a cross-sectional view showing an example of the configuration of a semiconductor device according to a fourth embodiment of the present invention.

FIG. 9 is a cross-sectional view showing an example of the configuration of a semiconductor device 1 according to the fourth embodiment. Note that FIG. 9 shows a cross section (corresponding to A-A cross section of FIG. 4, B-B cross section of FIG. 6) of the region in which the emitter electrode 17 is formed.

As shown in FIG. 9, in the vicinity of the terminal region 16, a protective layer 20 and a protective layer 31 are stacked and formed.

Note that, in the above description, the region in which the emitter electrode 17 is formed has been described as an example, but other electrodes also have similar configurations.

As described above, according to the fourth embodiment, by further separating the lateral surface of the semiconductor device 1 and the conductive layer 26 (further extending the distance between the semiconductor device 1 and the conductive layer 26), the discharge or short-circuit which occurs between the semiconductor device 1 and the conductive layer 26 can be further restrained.

Note that the present invention can appropriately modify or omit Embodiments within the scope of the present invention.

The present invention has been described in detail, but the descriptions are illustrative in all aspects, and the present invention is not limited thereto. It is understood that numerous modification examples, which are not shown as examples, are conceivable without departing from the scope of the present invention.

REFERENCE SIGNS LIST

1: semiconductor device
2: semiconductor evaluation apparatus
3: probe base
4: chuck stage
5: evaluation/control unit
6: insulating base
7: contact probe
8: moving arm
9: connection part
10: signal line
11: connection part
12: signal line
13: through hole
14: camera
15: element region
16: terminal region
17, 18: emitter electrode
19: gate electrode
20: protective layer
21: opening part
22: protective layer
23: opening part
24: protective layer
25: opening part
26 to 28: conductive layers
29: collector electrode
30: protective laye

The invention claimed is:

1. A semiconductor device having a semiconductor element region, in which a semiconductor element is formed, and a terminal region provided in an outer peripheral part of said semiconductor element, the semiconductor device comprising:
  a plurality of electrodes formed on a surface of said semiconductor element;
  a protective layer having opening parts respectively provided vertically over the semiconductor element at each electrode such that a portion of each said electrode is exposed at the opening parts, and vertically over and covering the other portions of said electrodes excluding said portion of said electrodes exposed at said opening part, said protective layer being insulative; and
  a conductive layer formed so as to cover said protective layer and said opening parts and directly connected to said electrodes at said opening parts, wherein
  said electrodes have substantially the same electric potential, and
  said conductive layer is formed across said electrodes, wherein said protective layer has a plurality of said opening parts for each said electrode.

2. The semiconductor device according to claim 1, wherein said protective layer is formed by stacking a plurality of layers.

3. The semiconductor device according to claim 2, wherein said layers of said protective layer are formed of mutually different materials.

4. The semiconductor device according to claim 2, wherein said layers of said protective layer are formed such that an upper-side layer covers a lower-side layer on an inner surface of said opening parts.

5. The semiconductor device according to claim 1, wherein said conductive layer is formed by stacking a plurality of layers.

6. The semiconductor device according to claim 5, wherein said layers of said conductive layer are formed of mutually different materials.

7. A semiconductor device having an element region, in which a semiconductor element is formed, and a terminal region provided in an outer peripheral part of said element region, the semiconductor device comprising:
- a plurality of electrodes formed on a surface of said element region;
- a protective layer having opening parts respectively provided at each electrode such that a portion of each said electrode is exposed at the opening parts, and vertically over and covering the other portions of said electrodes excluding said portion of said electrodes exposed at said opening part, said protective layer being insulative; and
- a conductive layer formed so as to cover said protective layer and said opening parts and directly connected to said electrodes at said opening parts, wherein
- said electrodes have substantially the same electric potential, and said conductive layer is formed across said electrodes, wherein said conductive layer is separately formed for each said opening part.

8. A semiconductor device having an element region, in which a semiconductor element is formed, and a terminal region provided in an outer peripheral part of said element region, the semiconductor device comprising:
- a plurality of electrodes formed on a surface of said element region;
- a protective layer having opening parts respectively provided at each electrode such that a portion of each said electrode is exposed at the opening parts, and vertically over and covering the other portions of said electrodes excluding said portion of said electrodes exposed at said opening part, said protective layer being insulative; and
- a conductive layer formed so as to cover said protective layer and said opening parts and directly connected to said electrodes at said opening parts, wherein
- said electrodes have substantially the same electric potential, and said conductive layer is formed across said electrodes, wherein said conductive layer is separately formed for each said electrode.

9. The semiconductor device according to claim 1, wherein said conductive layer is not formed at an end of said semiconductor device.

10. The semiconductor device according to claim 1, wherein said protective layer is formed of a photoresist.

11. The semiconductor device according to claim 1, wherein said protective layer is formed of polyimide.

12. The semiconductor device according to claim 1, wherein
said protective layer is a sheet material formed polyimide, and
said sheet material has an adhesive layer.

13. The semiconductor device according to claim 1, wherein said conductive layer is a metal film.

14. The semiconductor device according to claim 13, wherein said metal film has aluminum as a main component.

15. The semiconductor device according to claim 13, wherein said metal film has gold as a main component.

16. A semiconductor device having an element region, in which a semiconductor element is formed, and a terminal region provided in an outer peripheral part of said element region, the semiconductor device comprising:
- a plurality of electrodes formed on a surface of said element region;
- a protective layer having opening parts respectively provided at each electrode such that a portion of each said electrode is exposed at the opening parts, and vertically over a top surface of each electrode and covering the other portions of said electrodes excluding said portion of said electrodes exposed at said opening part, said protective layer being insulative; and
- a continuous conductive material layer formed so as to cover said protective layer and said opening parts and directly connected to said electrodes at said opening parts, wherein
- said electrodes have substantially the same electric potential,
- said conductive layer is formed across said electrodes, and exposed, sized, and shaped to receive contact probes of a semiconductor evaluation apparatus,
- said protective layer is formed by stacking a plurality of layers, and
- the plurality of layers include a second protective layer stacked on a first protective layer such that a vertical distance between an upper surface of the element region and the conductor layer on the terminal region side of the opening is greater than a vertical distance between an upper surface of the element region and the conductor layer on the element region side of the opening.

17. The semiconductor device according to claim 1, wherein
said protective layer is vertically over a top surface of each electrode, and
said conductive layer is exposed, sized, and shaped to receive contact probes of a semiconductor evaluation apparatus.

18. The semiconductor device according to claim 7, wherein
said protective layer is vertically over a top surface of each electrode, and
said conductive layer is exposed, sized, and shaped to receive contact probes of a semiconductor evaluation apparatus.

19. The semiconductor device according to claim 8, wherein
said protective layer is vertically over a top surface of each electrode, and
said conductive layer is exposed, sized, and shaped to receive contact probes of a semiconductor evaluation apparatus.

* * * * *